（12）United States Patent
St. Germain et al.

(10) Patent No.: US 11,107,753 B2
(45) Date of Patent: Aug. 31, 2021

(54) PACKAGING STRUCTURE FOR GALLIUM NITRIDE DEVICES

(71) Applicant: SEMICONDUCTOR COMPONENTS INDUSTRIES, LLC, Phoenix, AZ (US)

(72) Inventors: Stephen St. Germain, Gilbert, AZ (US); Roger Arbuthnot, Mesa, AZ (US); David Billings, Mesa, AZ (US); Andrew Celaya, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 41 days.

(21) Appl. No.: 16/203,072

(22) Filed: Nov. 28, 2018

(65) Prior Publication Data
US 2020/0168529 A1    May 28, 2020

(51) Int. Cl.
*H01L 23/495* (2006.01)
*H01L 25/065* (2006.01)
(Continued)

(52) U.S. Cl.
CPC ........ *H01L 23/4952* (2013.01); *H01L 21/565* (2013.01); *H01L 23/3157* (2013.01);
(Continued)

(58) Field of Classification Search
CPC .............. H01L 23/4952; H01L 21/565; H01L 23/3157; H01L 23/64; H01L 25/0655;
(Continued)

(56) References Cited

U.S. PATENT DOCUMENTS

| 5,752,182 A | * | 5/1998 | Nakatsuka | ............ | H01L 23/645 257/E25.029 |
| 6,147,876 A | * | 11/2000 | Yamaguchi | ............. | H01L 23/24 257/698 |

(Continued)

OTHER PUBLICATIONS

Ozkilic, et al., A Novel Intelligent Power Module (IPM) in a Compact Transfer Mold Package with New High Voltage Integrated Circuit (HVIC) and Integrated Bootstrap Diodes, Proceedings of 14th International Power Electronics and Motion Control Conference EPE-PEMC 2010, Sep. 6-8, 2010, 3 pages.

(Continued)

*Primary Examiner* — Mouloucoulaye Inoussa
(74) *Attorney, Agent, or Firm* — Adam R. Stephenson, Ltd.

(57) ABSTRACT

Implementations of semiconductor packages may include: a substrate having one or more traces on a first side and one or more traces on a second side of the substrate. The substrate may be rigid. The packages may include at least one die mechanically and electrically coupled to the first side of the substrate. The die may be a high voltage die. The package may include one or more traces along one or more edges of the substrate. The one or more traces along the one or more edges of the substrate provide electrical connectivity between the one or more traces on the first side of the substrate and the one or more traces on the second side of the substrate. The package may also include a molding compound encapsulating at least the first and the one or more edges of the ceramic substrate.

17 Claims, 11 Drawing Sheets

(51) Int. Cl.
*H01L 23/64* (2006.01)
*H01L 21/56* (2006.01)
*H01L 23/31* (2006.01)
*H01L 29/20* (2006.01)

(52) U.S. Cl.
CPC .......... *H01L 23/64* (2013.01); *H01L 25/0655* (2013.01); *H01L 29/2003* (2013.01)

(58) Field of Classification Search
CPC .............. H01L 32/49513; H01L 24/33; H01L 23/3107; H01L 23/49568; H01L 23/49537; H01L 23/49582; H01L 24/17; H01L 24/73; H01L 24/83; H01L 24/81; H01L 24/92; H01L 21/78; H01L 21/561; H01L 24/97
USPC .............. 257/666, 678, 676, 700, 718, 690, 257/E23.044, E23.051, E23.052; 438/113, 122, 123
See application file for complete search history.

(56) References Cited

U.S. PATENT DOCUMENTS

| | | | | |
|---|---|---|---|---|
| 6,278,178 | B1* | 8/2001 | Kwon | H01L 23/3121 257/684 |
| 2003/0128526 | A1* | 7/2003 | Sakai | H05K 3/403 361/736 |
| 2005/0207697 | A1* | 9/2005 | Kek | H01L 25/167 385/15 |
| 2007/0138651 | A1* | 6/2007 | Hauenstein | H01L 23/13 257/782 |
| 2008/0265356 | A1* | 10/2008 | Biar | H01L 27/14618 257/434 |
| 2009/0289342 | A1* | 11/2009 | Kasuya | H05K 3/403 257/690 |
| 2010/0288541 | A1* | 11/2010 | Appelt | H01L 23/49827 174/257 |
| 2016/0268185 | A1* | 9/2016 | Mcknight-Macneil | H01L 23/49575 |
| 2019/0035701 | A1 | 1/2019 | Iwamoto | |

OTHER PUBLICATIONS

GaN Systems, Inc. Top-side Cooled 650 V E-mode GaN Transistor, Preliminary Datasheet, 2009, 15 pages.
Texas Instruments, Inc., LMG5200—80V GaN Half Bridge Power Stage, Downloaded from the Internet: http://www.ti.com/product/LMG5200, Oct. 26, 2018, 2 pages.
Texas Instruments, Inc., LMG5200—80V, 10-A GaN Half-Bridge Power Stage, Data Sheet, SNOSCY4D, Mar. 2015—Revised Mar. 2017, 29 pages.
Minco Products, Inc., Flex Circuits Design Guide, Doc # FCSG014, 2015, 32 pages.
Stmicroelectronics, Inc., PWD13F60—High-Density Power Drive—High Voltage Full Bridge with Integrated Date Driver, Doc ID 030865-Rev 2, Data Sheet—Production Data, Nov. 2017, 26 pages.

* cited by examiner

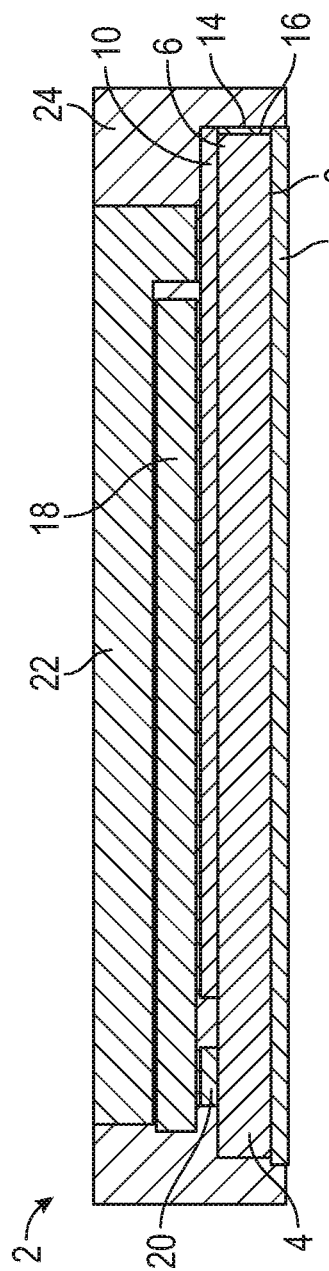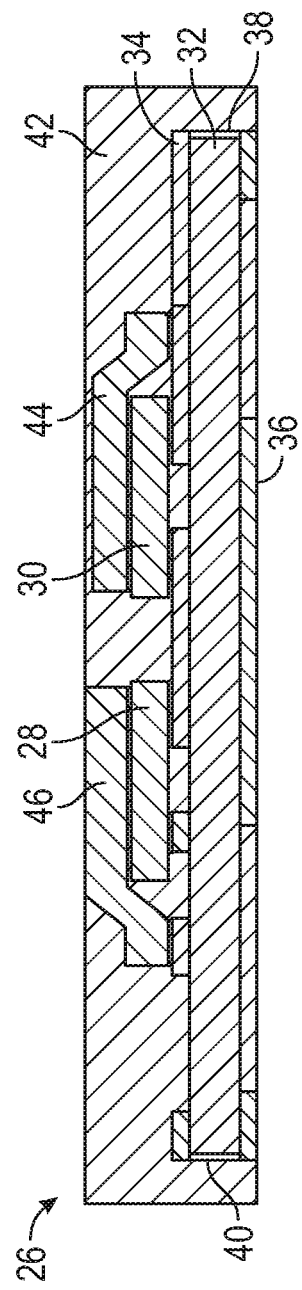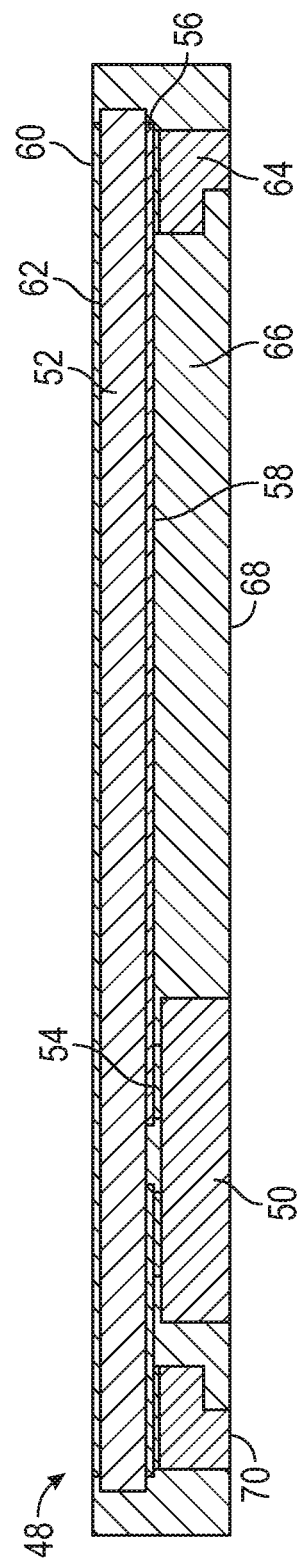

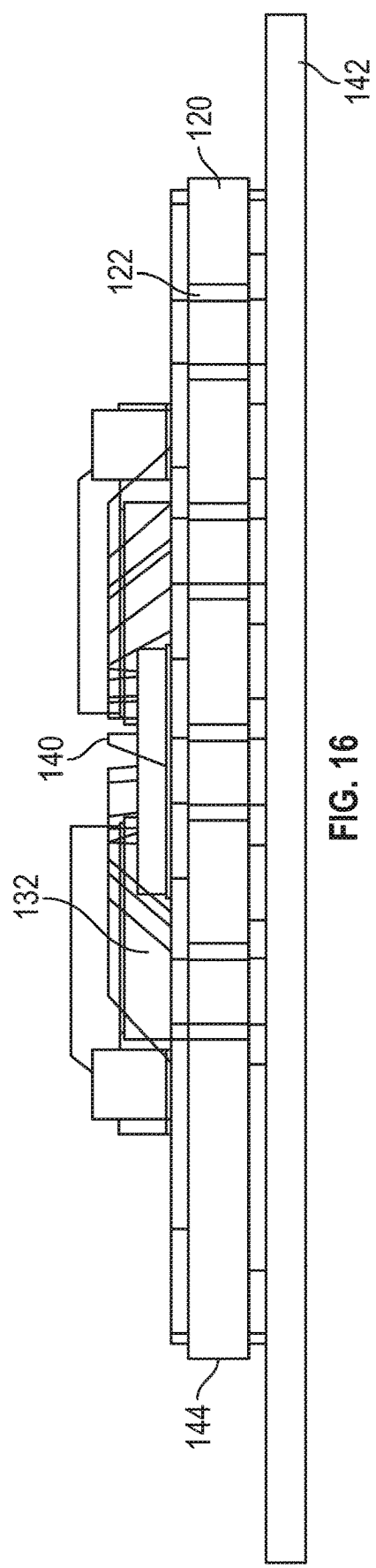
FIG. 16
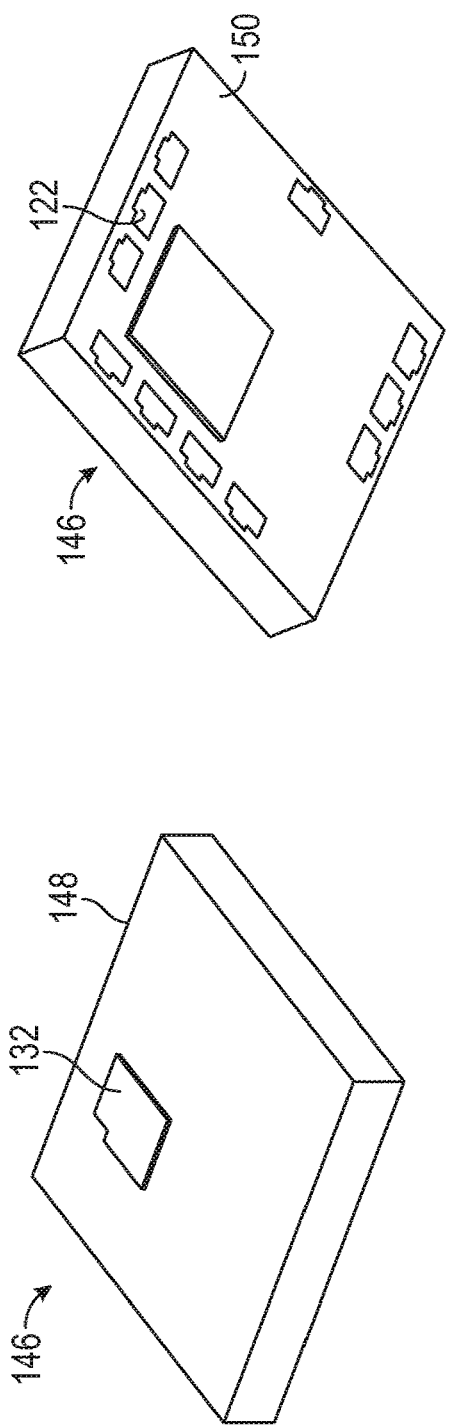
FIG. 17
FIG. 18

PACKAGING STRUCTURE FOR GALLIUM NITRIDE DEVICES

BACKGROUND

1. Technical Field

Aspects of this document relate generally to semiconductor packages, such as power modules for electronic devices. More specific implementations involve single die modules and multi die modules such as switches.

2. Background

Power modules having high voltage die include lead frames or printed circuit board substrates. High voltage die are known to produce large amounts of heat due to large voltages and fast switching speeds. The die can be electrically coupled through clips and wirebonds to power and signal.

SUMMARY

Implementations of semiconductor packages may include: a substrate having one or more traces on a first side and one or more traces on a second side of the substrate. The substrate may be rigid. The packages may include at least one die mechanically and electrically coupled to the first side of the substrate. The die may be a high voltage die. The package may include one or more traces along one or more edges of the substrate. The one or more traces along the one or more edges of the substrate may provide electrical connectivity between the one or more traces on the first side of the substrate and the one or more traces on the second side of the substrate. The package may also include a molding compound encapsulating at least the first and the one or more edges of the substrate.

Implementations of semiconductor packages may include one, all, or any of the following:

The substrate may be ceramic and the ceramic may be aluminum nitride, aluminum oxide, or any combination thereof.

The substrate may be a direct bonded copper substrate.

The die may include gallium nitride.

The package may further include one of a clip or two or more wire bonds electrically coupling the one or more die to the substrate.

The clip may include a thickness from a 3 mil to a 20 mil.

The package may also include one or more copper pillars coupled to the first side or the second side of the substrate.

Implementations of semiconductor packages may include: a ceramic substrate comprising one or more traces on a first side and one or more traces on a second side of the ceramic substrate. The ceramic substrate may be electrically insulative. The package may also include at least one die mechanically and electrically coupled to the first side of the ceramic substrate. The at least one die may be a high voltage die. The package may also include one or more traces extending from the first side to the second side of the ceramic substrate. The package may also include a molding compound encapsulating at least the first side and the one or more edges of the ceramic substrate. The one or more traces in the package may provide electrical connectivity between the one or more traces on the first side of the ceramic substrate and the one or more traces on the second side of the ceramic substrate.

Implementations of semiconductor packages may include one, all, or any of the following:

The substrate may be ceramic and may include aluminum nitride, aluminum oxide, or any combination thereof.

The die may include gallium nitride.

The package may further include one of a clip or two or more wirebonds electrically coupling the one or more die to the substrate.

The clip may include a thickness from a 3 mil to a 20 mil.

The package may further include one or more copper pillars coupled to the first side or the second side of the ceramic substrate.

Implementations of a method of forming a semiconductor package may include: providing two or more electrically insulative substrates each having a first side and a second side and a plurality of openings therethrough. The method may also include forming one or more traces through the plurality of openings from a first side of the two or more electrically insulative substrates to the second side of the two or more electrically insulative substrates. Forming one or more traces on each of the first side and the second side of the two or more electrically insulative substrates may also be included in a method of forming semiconductor packages. The method may also include singulating the two or more electrically insulative substrates at the plurality of openings. The method also includes coupling one or more die to the first side of each of the two or more electrically insulative substrates and encapsulating the one or more die and each of the two or more electrically insulative substrates.

Implementations of methods of forming semiconductor packages may include one, all, or any of the following:

The one or more traces on the second side of the electrically insulative substrate may be exposed.

The one or more traces may be formed along one or more edges of each of the two or more electrically insulative substrates.

The method may further include forming one or more vias in a planar surface of the electrically insulative substrate.

The method may further include coupling one of one or more clips or two or more wirebonds to the one or more die and the one or more traces.

The one or more clips may have a thickness from a 3 mil to a 20 mil.

The electrically insulative substrate may be a ceramic or a direct bonded copper substrate.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 1 is a cross sectional view of an implementation of a semiconductor package;

FIG. 2 is a cross sectional view of another implementation of a semiconductor package;

FIG. 3 is a cross sectional view of an implementation of a semiconductor package;

FIG. 16 is a side view of substrate coupled to a mounting tape;

FIG. 17 is a perspective view of an implementation of a first side semiconductor after encapsulation;

FIG. 18 is a perspective view of an implementation of a second side of an encapsulated semiconductor package;

DESCRIPTION

Figure 4:
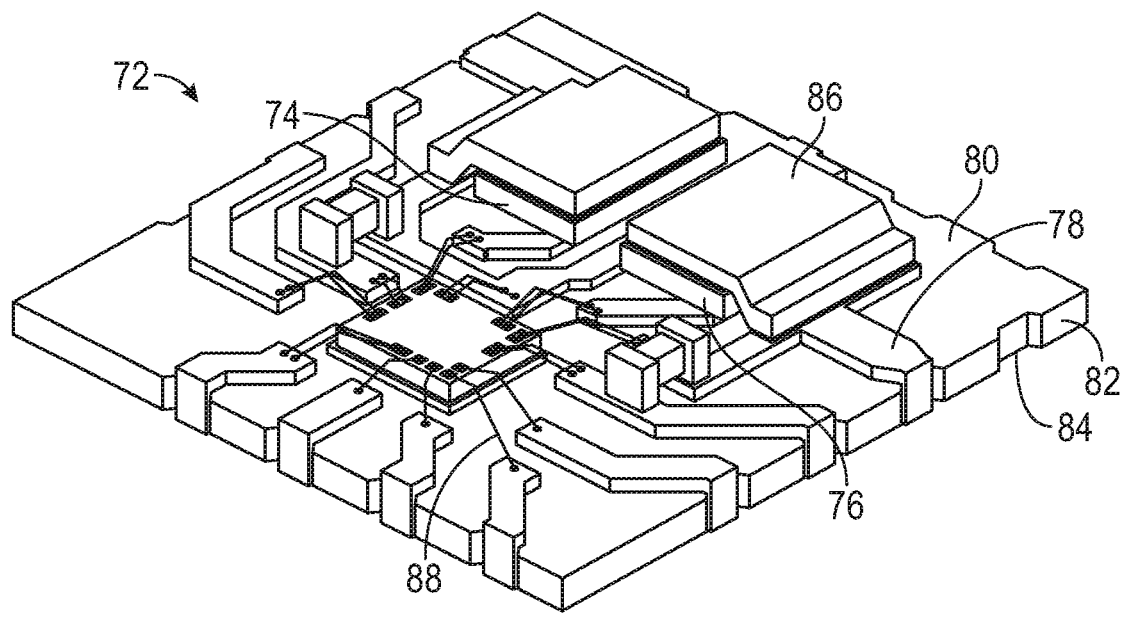
FIG. 4 is a top perspective view of an implementation of a semiconductor package having two die.

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Referring to FIG. 1, an implementation of a semiconductor package 2 is illustrated. The semiconductor package 2 is an example of a single high voltage die package. The package includes a rigid substrate 4 having a first side 6 and a second side 8. The substrate 4 may be/include an electrically isolative material. The electrically isolative material may also be thermally insulative. Because the electrically isolative material is thermally insulative, the main thermal path may be out a second side 8 of the package. In various implementations, the substrate may be a direct bonded copper (DBC) substrate. In other implementations, the substrate may include a thick film pattern on a ceramic substrate. By non-limiting example, the ceramic substrate may include aluminum nitride (AlN), aluminum oxide ($Al_2O_3$), or any combination thereof. The AlN ceramic may provide additional thermally insulative performance. Traces 10 and 12 are on the first side 6 and the second side 8 of the substrate 4. The traces may be copper in various implementations. In other implementations, the traces may be gold, nickel, tin, lead, any combination or alloy thereof (including with copper), or other electrically conductive material. The traces 10 and 12 on the first side 6 and the second side 8 of the substrate 4 are connected through a trace 14 on an edge 16 of the substrate 4. In various implementations, there may be one or more traces on/across one or more edges of the substrate. In various implementations, there may be multiple traces on/across a single edge of the substrate and several edges of the substrate may include traces. The traces may provide electrical/thermal connectivity between the traces on the first side and the second side of the substrate.

A die 18 is coupled to the first side 6 of the substrate 4. The die may be coupled through conductive materials such as epoxy, die attach film, solder, silver sinter, or any other materials capable of bonding the die to substrate. In some implementations, the die 18 may be coupled to conductive traces 10 using flip chip technology using balls or pillars. In various implementations, the die is a high voltage die, meaning that the die is intended to handle greater than 200 V input potential. The die may be formed of a substrate material that may be, by non-limiting example, gallium nitride, silicon dioxide, glass, silicon-on-insulator, gallium arsenide, sapphire, ruby, silicon carbide, polycrystalline or amorphous forms of any of the foregoing, and any other type of substrate type for semiconductor devices. All regions of the high voltage die 18 may be coupled directly to the substrate 4 through the traces 10. The die 18 is also electrically coupled to the substrate through pillars 20. In various implementations, the pillars may be copper. In other implementations, the package may not include pillars. The die is also electrically coupled to a clip 22. In some implementations, the clip may be copper. In various implementations, the clip may have a thickness ranging from about 3 mil to about 20 mil. In some implementations, the clip may have a 5 mil thickness. In other implementations, the clip may have a thickness of a 10 mil. By non-limiting example, the clips may be half etched, formed or may be a combination of formed and half etched. In still other implementations, wire bonds may be used in place of clips.

As illustrated in FIG. 1, the package 2 also includes a molding compound 24 encapsulating the first side 6 of the substrate 4 and the edges 16 of the substrate. In various implementations, one or more edges of the substrate may be encapsulated. In other implementations, no components on the edges of the device/package are exposed. As illustrated the clip 22 is not encapsulated by the molding compound 24, this may provide electrical/thermal connectivity for the package when incorporated into a larger device. The exposed clip 22 may also allow for better heat dispersal. In various implementations, the traces 10 and 12 on the substrate 4 may also exposed for connectivity and thermal performance. In implementations, the traces 12 on the second side of the substrate are exposed. In some implementations, the molding compound may include epoxy, resins, thermoplastics, and other molding compounds suitable for high voltage packaging. The molding compound type may be selected so as to improve the reliability of the package.

Referring to FIG. 2, another implementation of a semiconductor package 26 is illustrated. The semiconductor package includes two die 28 and 30 coupled to a rigid substrate 32 through traces 34. Traces 34 and 36 are coupled to a first side of the substrate and a second side of the substrate, respectively. The substrate 32 may be a direct bond copper substrate (DBC), a thick film pattern on ceramic substrate, or other rigid and thermally and electrically insulative material. In implementations where the substrate 32 is a DBC substrate, the DBC substrate may include a ceramic plate sandwiched between two copper layers, one of the layers forming connections with traces on the first side of the substrate with traces located internally and extending to the second side of the substrate. In other implementations, the DBC substrate may include a ceramic plate and only a single copper layer, the single copper layer forming connections with traces on the second side of the substrate. The copper layer on the DBC may extend to the second side of the substrate through traces on the edges of the substrate.

Figure 8:
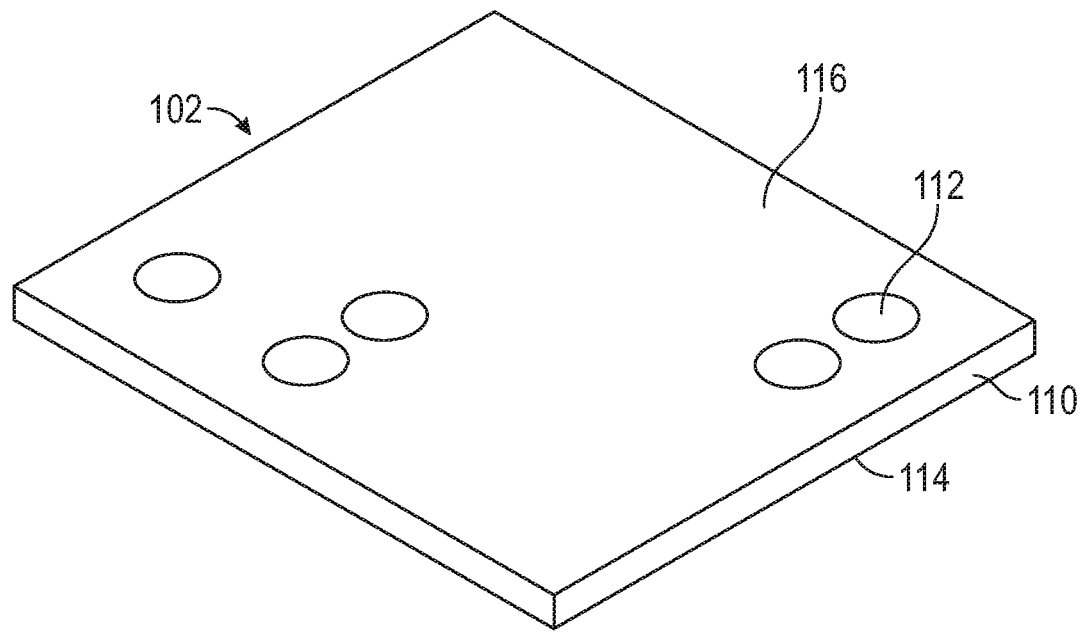
FIG. 8 is a perspective view of an implementation of a substrate having vias extending from a first side of the substrate to the second side of the substrate.

The substrate 32 and related packaging in various implementation maintain electrical isolation inside and outside the package. The traces on the first side 34 and the second side 36 are electrically connected through traces 38 on the edges 40 of the substrate 32. In various implementations, the traces extending from a first side of the substrate to a second side of the substrate may go directly through the substrate as illustrated in FIG. 8. The traces extending from the first side of the substrate to the second side of the substrate may be formed through drilling, molding, or laser drilling. In various implementations, the traces 34, 36, 38 include copper. In other implementations, the traces may be formed from gold, silver, aluminum, tin, nickel, any alloy thereof, and other electrically conductive materials. The use of a rigid substrate having traces extending from a first side of the substrate to the second side of the substrate may reduce package size while allowing thermal transfer and maintaining electrical isolation within the package. Silica may be used in various implementations as a solder stop/standoff.

The semiconductor package 26 in FIG. 2 is encapsulated with a molding compound 42. The molding compound 42 encapsulates the edges 40 of the package with no side features exposed. On the first side of the substrate 32 the molding compound 42 encapsulates the die 28, 30 and a portion of the clips 44, 46 as illustrated. The clips 44, 46 electrically couple the die 28, 30 with the traces 34, 36 on the substrate 32. Some portion of the clips 44, 46 are exposed through the molding compound 42 allowing for electrical connectivity with other components in a larger semiconductor device. By non-limiting example, the semiconductor package may be coupled to a motherboard, printed circuit board (PCB), a heat sink, heat spreader, or heat pipe(s), one or more power sources, one or more electrical grounds, and/or any other electrical components by attaching exposed traces on a second side of the package with contacts of these elements using solder, a conductive adhesive, and the like. In some implementations, further packaging of the individual semiconductor packages may take place prior to making such connections. In other implementations, the packages may be stacked and multiple packages may be electrically connected through both the exposed clips and the exposed traces.

In various implementations of semiconductor packages as described herein, the die within the package may be a power semiconductor die such as, by non-limiting example, a power metal-oxide-semiconductor field-effect transistor (power MOSFET), an insulated gate bipolar transistor (IGBT) and/or other power semiconductor die types. In other implementations, packages may not include a power semiconductor die but may include various passive components capable of handling high voltages. In other implementations, the package may include one or more power semiconductor die in addition to one or more non-power semiconductor die.

Referring to FIG. 3, another implementation of a semiconductor package 48 is illustrated. The package 48 includes a single die 50 coupled to a substrate 52 through flip chip connections 54. In various implementations, the die 50 is a high voltage die. High voltage die may reach higher temperatures during operation than silicon die. The higher temperatures are due to large voltages and faster switching speeds characteristic of high voltage die. In various implementations, the substrate 52 includes traces 56 on a first side 58 of the substrate 52 and traces 62 on a second side 60 of the substrate 52. The traces may be copper traces in various implementations. In other implementations, the traces may be gold, tin/lead, silver, aluminum, any alloy thereof, and other high reliability electrically conductive material.

As illustrated, in FIG. 3, the package 48 includes pillars 64 coupled to traces 56 on the substrate 52 and extending to outside the molding compound 66 of the package. The molding compound 66 encapsulates the edges of the substrate. On a first side 68 of the package 48 a second end 70 of the pillar is exposed to allow electrical connectivity with components in an electrical device. Similarly, the traces 60 on the second side 62 of the substrate 52 are not encapsulated with molding compound 66 to allow heat dissipation as well as electrical connectivity.

Figure 5:
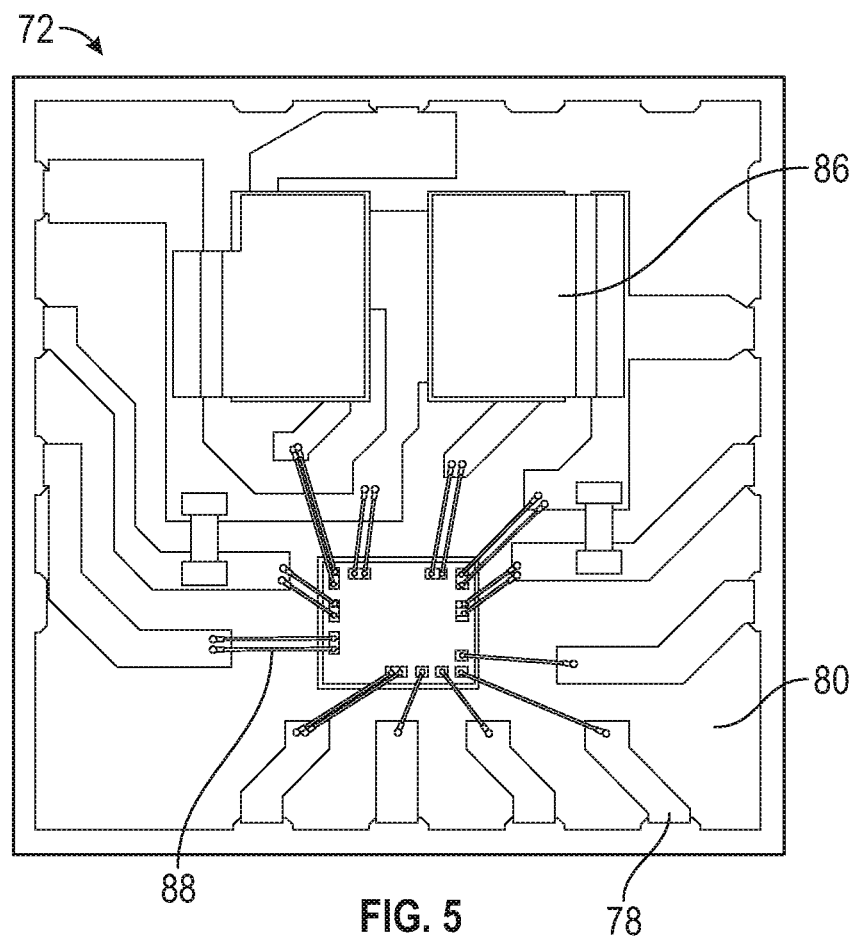
FIG. 5 is a top view of an implementation of a semiconductor package.

Referring to FIG. 4, a perspective view of an implementation of a semiconductor package 72 is illustrated without the molding compound included. In FIG. 5, a top view of the first side of the semiconductor package 72 is illustrated. The package 72 includes two die 74 and 76 coupled to traces 78 on a substrate 80. In various implementations, the substrate 80 may be rigid and may include ceramic. In some implementations, the ceramic may include aluminum nitride (AlN), aluminum oxide ($Al_2O_3$), or any combination thereof. The ceramic substrate 80 includes traces 78 extending from a first side 82 of the substrate 80 to a second side 84 of the substrate 80. In various implementations, the traces may be formed in lines formed on the substrate through thick film patterning. Traces extending from a first side of the substrate to the second side of the substrate may be formed through drilling, punching, etching, molding, and other methods of making holes in rigid materials.

The die 74 and 76 are electrically coupled to other components in the package through clips 86 and wire bonds 88. In various implementations, other components may include capacitors, transistors and other passive components. In some implementations, the package may include only components and no semiconductor die. Forming traces through and around the substrate may aid in reducing package size. By non-limiting example, one or more substrates can be stacked and electrically coupled through clips and traces. In various implementations, the substrates may be stacked before or after encapsulation with molding compound. In some implementations, no wire bonds may be used in electrically coupling components within the semiconductor package because the use of the traces that connect across the edge of the package.

Figure 6:
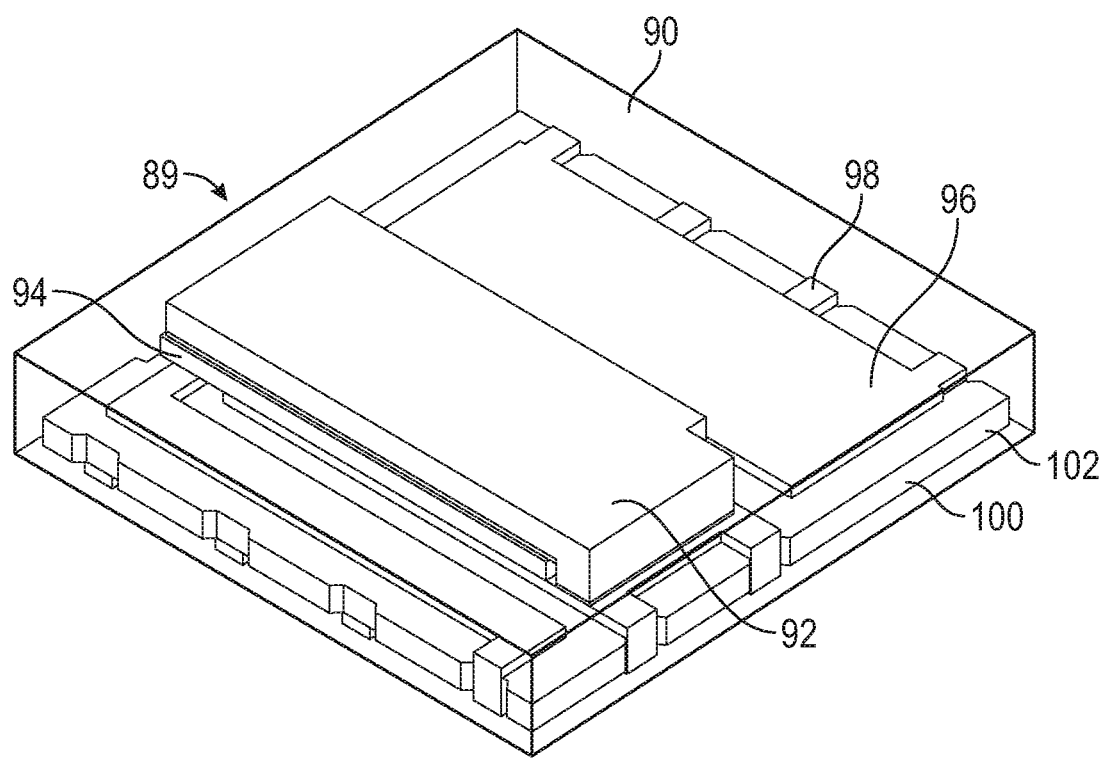
FIG. 6 is a perspective view of an implementation of a semiconductor package having one die.

Referring to FIG. 6, a semiconductor package 89 having one die is illustrated encapsulated with molding compound 90. In this illustration, the molding compound 90 is see through to allow visibility of the components within the package including the clip 92, the die 94, wire bonds 96, the traces 98, and the substrate 100. The molding compound 90 is illustrated encapsulating the edges 102 of the package 89 so no electrically conductive components are exposed. In this view, the clip is exposed to allow connectivity and heat dissipation. The traces on the second side of the substrate also are not encapsulated with molding compound for electrically connectivity. In various implementations, semiconductor packages can be stacked after encapsulation.

Figure 7:
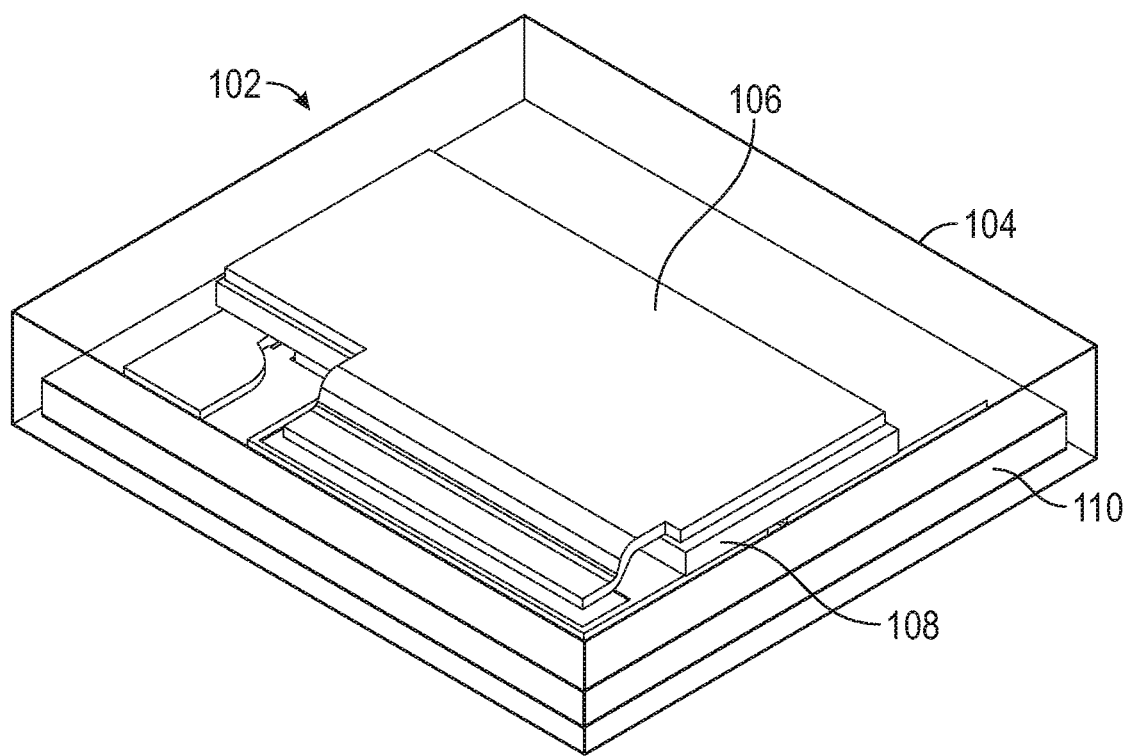
FIG. 7 is a perspective view of an implementation of a semiconductor package.

Referring to FIGS. 7 and 8, an implementation of a semiconductor package 102 is illustrated. In FIG. 7, the package 102 is illustrated encapsulated with molding compound 104. For illustrative purposes the molding compound is see through. A clip 106 coupling the die 108 to traces on the substrate 110 is illustrated. Referring to FIG. 8, traces/vias 112 extending from the first side 114 of the substrate 110 to the second side 116 of the substrate 110 are illustrated. Theses traces 112 allow electrical connectivity through an electrically insulative substrate 110. In various implementations, substrates may be stacked and electrically coupled together through the traces. The traces as illustrated and described herein may allow for smaller packaging.

Figure 9:
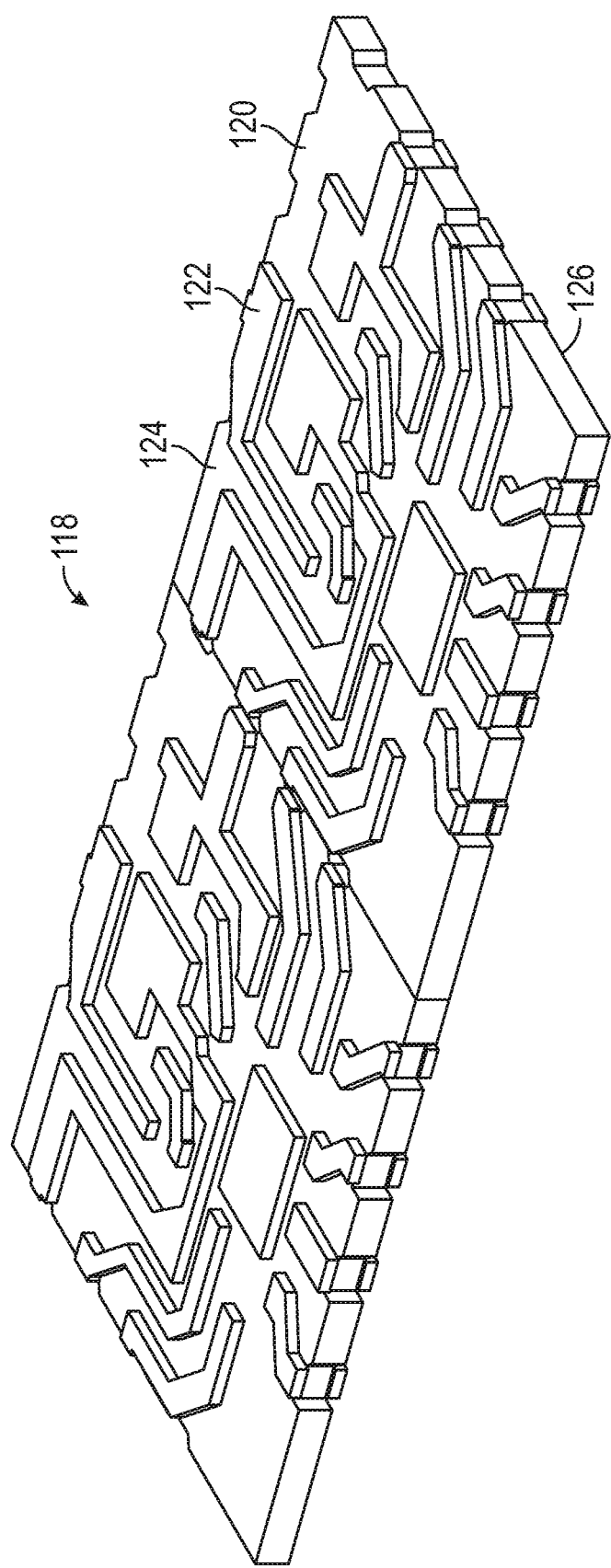
FIG. 9 is a perspective view of an implementation of a panel of substrates having traces.

Referring now to FIGS. 9-18, various elements used in a method of forming a semiconductor package are illustrated. The method of forming a semiconductor package includes providing a panel of substrates. In FIG. 9, an example of an implementation of a panel 118 of substrates 120 is illustrated. In this particular implementation, two substrates 120 are illustrated in the panel. In other implementations, more than two substrates may be included in a single panel. Each of the substrates includes traces 122 extending from a first side 124 of the substrate 120 to a second side 126 of the substrate 120. The method for forming a semiconductor package may include forming traces in the substrate. In various implementations, the traces may be formed through drilling, etching, patterning, or any other method mentioned herein. The traces may include copper, gold, silver, tin, nickel, any ally thereof, any combination thereof, or any electrically conductive materials previously described. Following formation of the traces, the substrates are then singulated.

Figure 10:
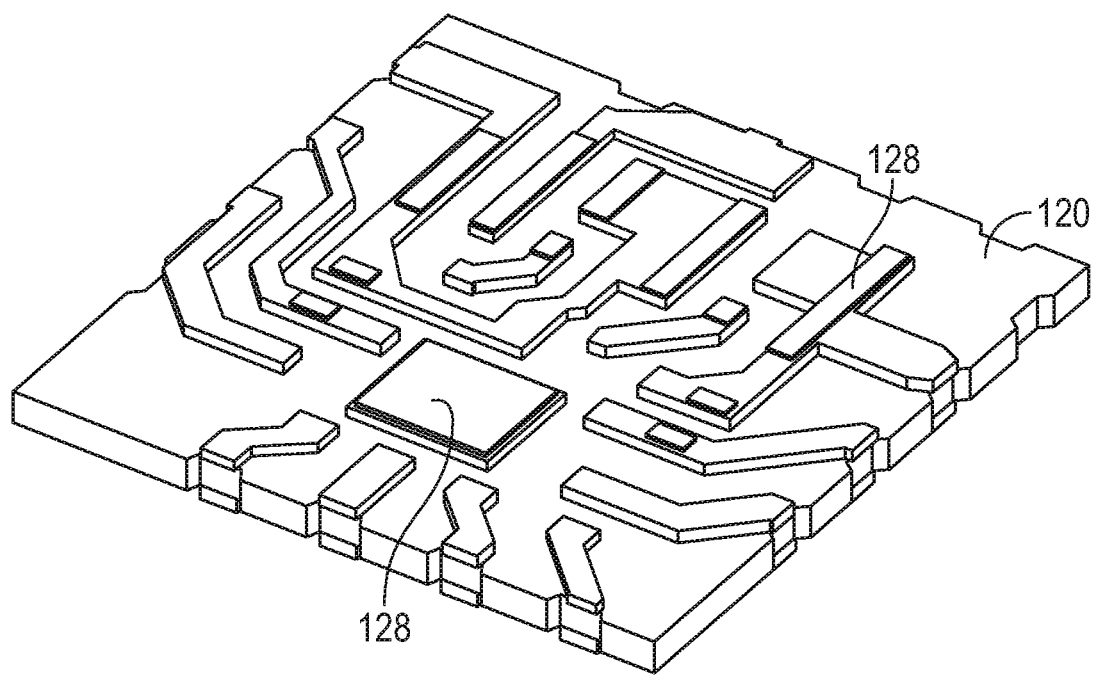
FIG. 10 is a perspective view of an implementation of a substrate having die attach material on the traces.
Figure 11:
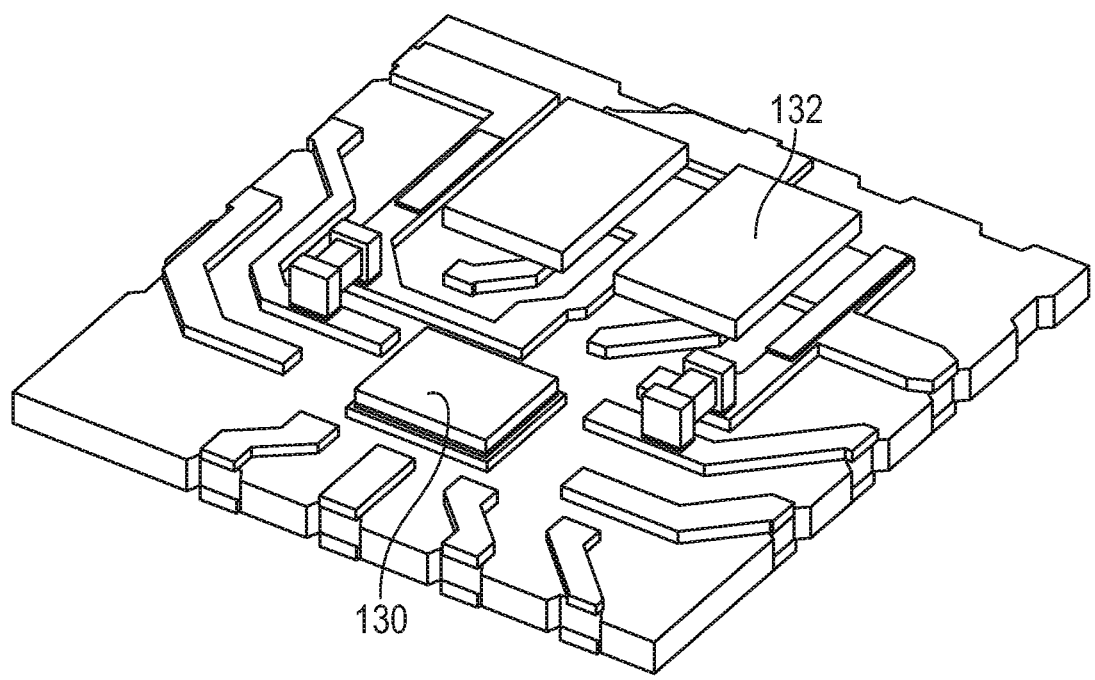
FIG. 11 is a perspective view of an implementation of die coupled to a substrate.

Referring to FIG. 10, the substrate 120 is illustrated having die attach material 128 coupled to the traces 122. The die attach material 128 may include silver sintering, epoxy, solder, and other electrically conductive materials. The die attach material 128 may be used to couple two or more die to the substrate. Other components may also be coupled to the substrate and traces thereon. The method of forming a semiconductor package may include coupling one or more die to the first side of each of the two or more substrates 120. Referring to FIG. 11, components 130 are illustrated coupled to the traces through the die attach material. In various implementations, the components may include gallium nitride (GaN) die 132. In other implementations, the components 130 may include capacitors, transistors, and other passive components. In some implementations, the components may form switches such as IGBT and MOSFETs. The components may include other high power semiconductor devices. The die may be coupled to the traces through flip chip methods. Flipping high voltage die onto a thermally conductive and electrically insulative substrate may allow a majority of heat to flow through the substrate. The insulative and isolative properties of the substrate may allow for different design rules in routing the interconnects between high voltage die and other components compared with copper lead frame designs. This is in part because the electrical connection routing needed to route the GaN die no longer needs to be handled via wire bonding, but through traces on the substrate while the connection to the opposing side of the GaN die is handled through the clip. Also, because only the clip is used to handle connections on one side of the GaN die, and the other interconnections are handled on the substrate itself, the other components of the substrate (and the other components around the package) do not need to follow traditional spacing design rules which require certain spacing be maintained to ensure no arcing takes place.

Figure 12:
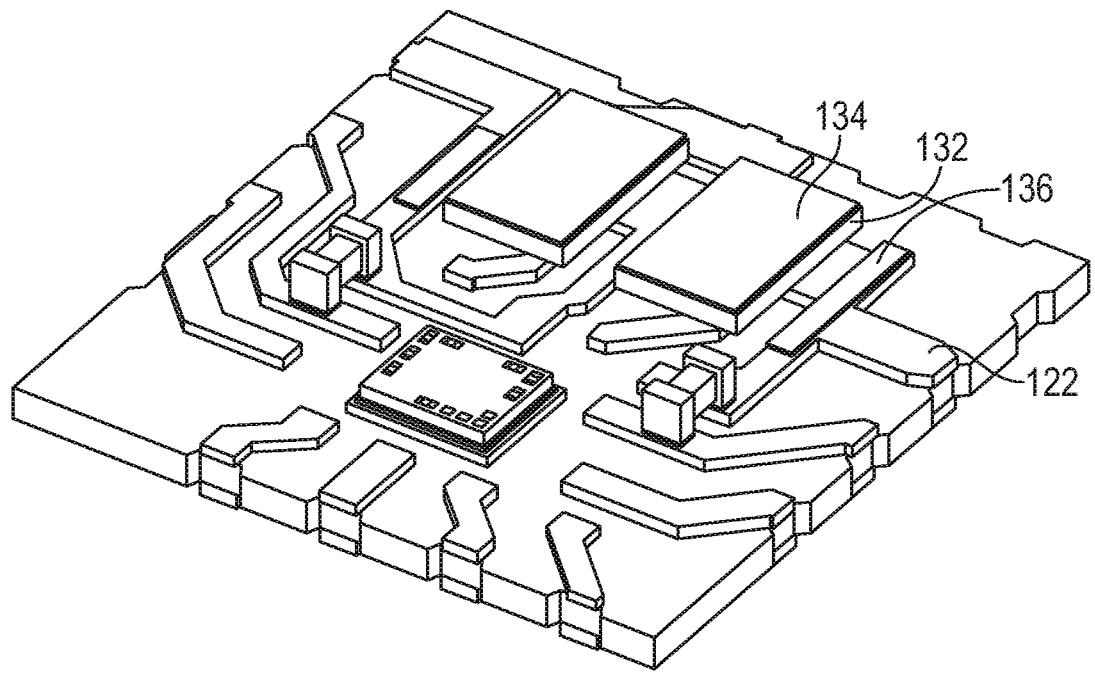
FIG. 12 is a perspective view of an implementation of adhesive on die.
Figure 13:
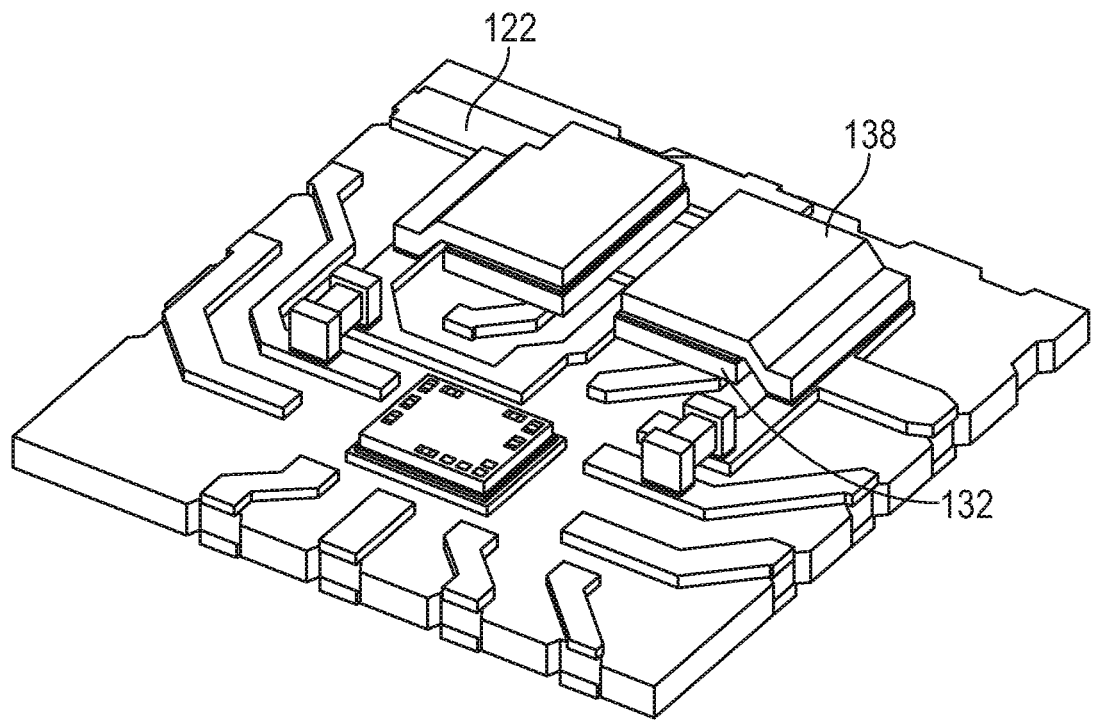
FIG. 13 is a perspective view of an implementation of clips coupled to the die and the substrate.
Figure 14:
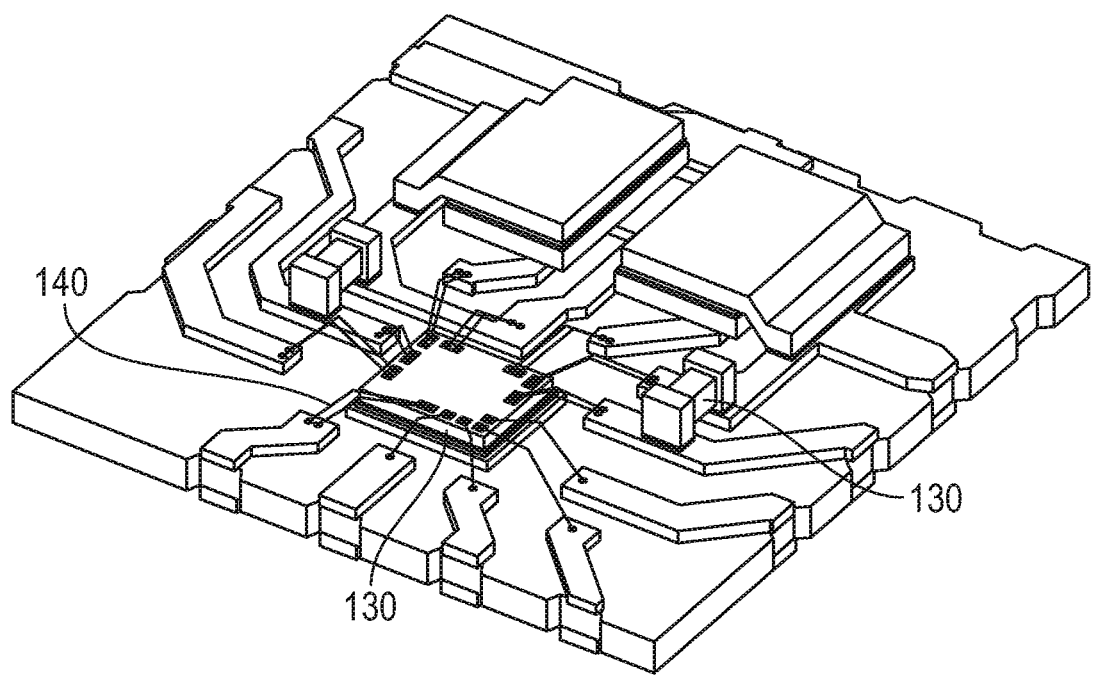
FIG. 14 is a perspective view of an implementation of a components on a substrate coupled through wire bonds.
Figure 15:
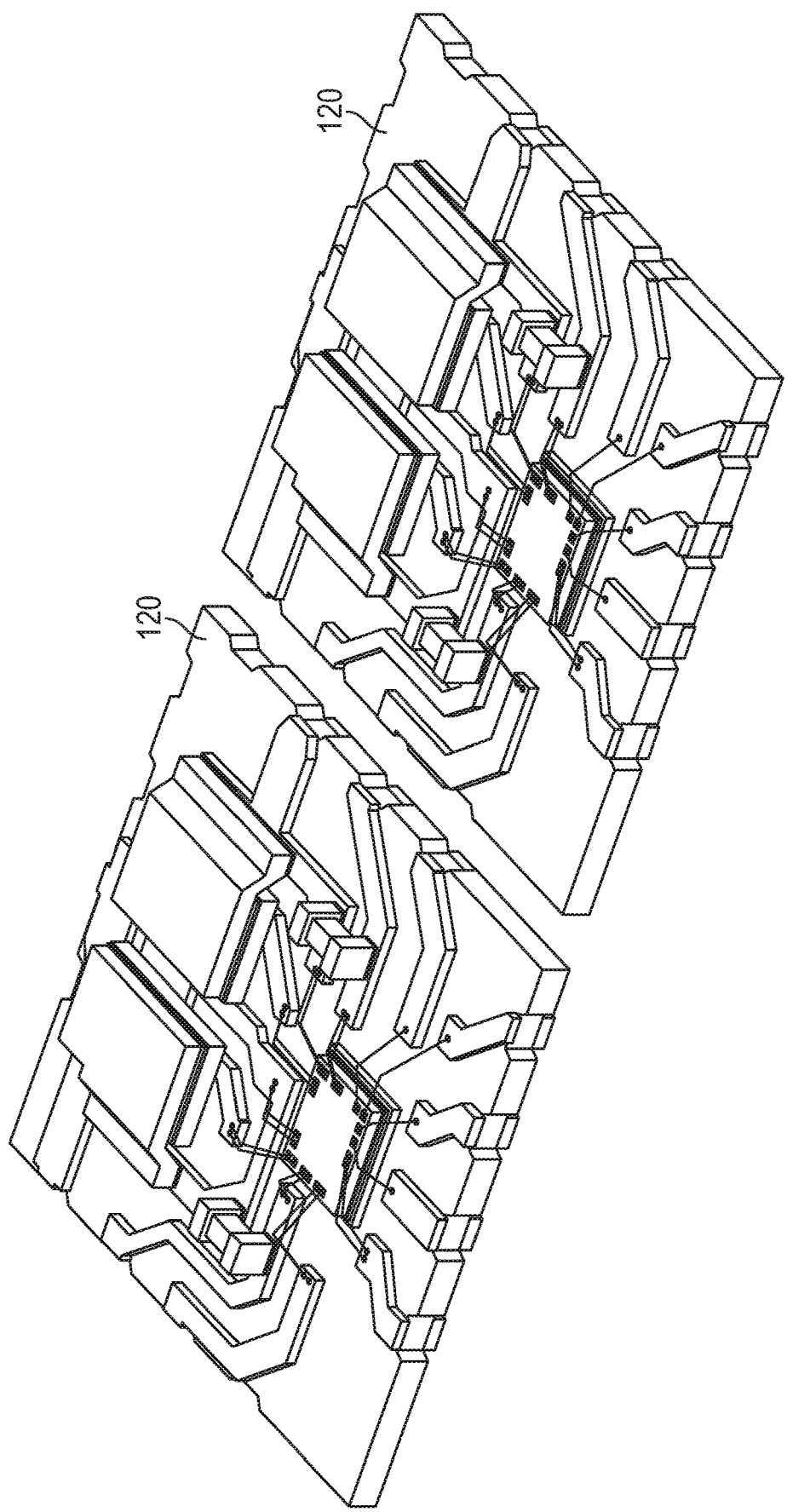
FIG. 15 is a perspective view of an implementation of two substrates after singulation.

Referring to FIG. 12, adhesive material 134 is illustrated coupled to a second side of the die 132. Adhesive material 136 is also applied to the traces 122. The adhesive material may include silver sinter, die attach film, epoxy, solder, and other electrically conductive materials. Referring to FIG. 13, the semiconductor package is illustrated having clips 138 coupled to the die 132 and the traces 122. The clips 138 electrically and mechanically couple the die 132 with the traces 122. The clips may be etched or half etched having a thickness ranging from a 3 mil to a 20 mil. In other implementations, the clips may be formed. In still other implementations, the method of manufacturing the clips may include a combination of forming the clips and etching the clips. After the clips have been coupled to the package, reflow and cure of the adhesive is performed. In other implementations, wirebonds may be used to couple the die 132 with the traces 122. In FIG. 14, the semiconductor package is illustrated after the components 130 have been coupled through wire bonds 140. The method of forming a semiconductor package also includes singulating the panel of substrates into individual substrates. Referring to FIG. 15, each of the substrates 120 are illustrated after singulation. In various implementations, the substrates may be singulated through laser cutting. The method may also include mounting a one or more substrates to a tape for further processing. An example of a substrate 120 mounted to a tape 142 is illustrated in FIG. 16. A double tape method may be used in various implementations. In this side view, the edges 144 of the substrate 120 are illustrated having traces 122 extending from a first side to a second side of the substrate. The wire bonds 140 are illustrated coupling the die 132 to the traces 122. In other implementations, the method may only include flip chip bonding and no wire bonds. In other methods, the wire bonds may be shortened compared with ordinary bond wire lengths because the ordinary design rules do not need to be applied.

The method further includes encapsulating the semiconductor package in molding compound. Referring to FIG. 17, a top view of the first side of the semiconductor package 146 is illustrated after encapsulation with a molding compound 148. The clip 132 is exposed on a first side of the semiconductor package. The exposed clip 132 may provide an additional thermal path through the package. In various implementations, an additional heatsink may be coupled to the clip or other cooling options may be added. In FIG. 18, a view of the second side 150 of the package 146 after encapsulation is illustrated. The traces 122 extending from the first side of the substrate to a second side of the substrate are exposed to provide connectivity to other semiconductor devices. The exposed traces may also provide an additional thermal path through the package.

Figure 19:
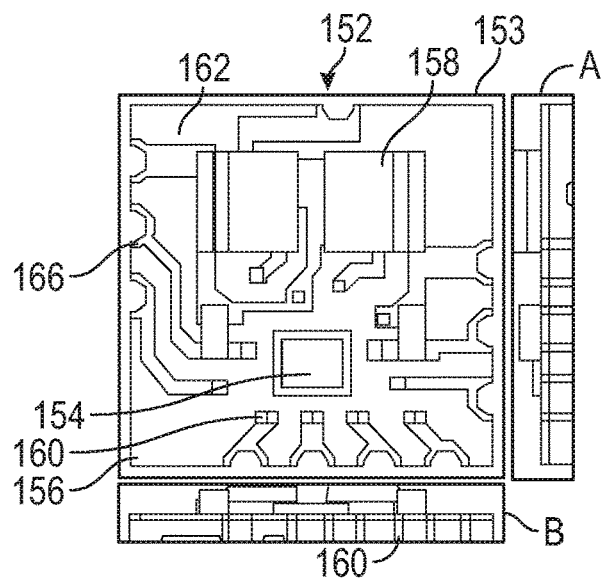
FIG. 19 is a top view of an implementation of a first side of a semiconductor package.
Figure 20:
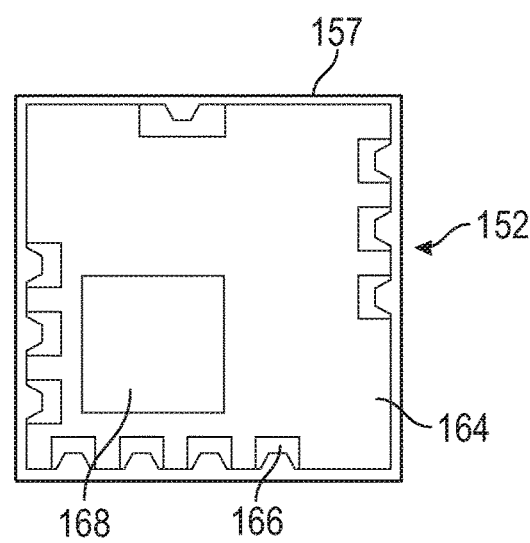
FIG. 20 is a top view of an implementation of a second side of a semiconductor package.

Referring to FIG. 19-20, an implementation of a multi-chip module 152 is illustrated. In FIG. 19, a top view of a first side 153 of the module 152 is illustrated where A is a side view of the edge adjacent and B is a side view of that edge adjacent. In FIG. 19, the components 154 coupled to the first side of the substrate 156 are illustrated. Two clips 158 are illustrated each coupled to a die. Traces 160 are illustrated extending from a first side 162 of the substrate 156 to a second side 164 of the substrate 156 within the perimeter of the substrate and also on the edges of the substrate. In various implementations, two or more wirebonds may couple the die to the traces. In FIG. 20, a top view of the second side 157 of the module 152 is illustrated. The traces 166 on the edges of the substrate are illustrated and a contact 168 for additional traces is illustrated having a square shape. In various implementations, contacts may include other geometric shapes.

In Table 1 and Table 2, results from simulations of the ceramic multi-chip module of FIG. 19 and a printed circuit board (PCB) device with similar components are illustrated. The simulations were run with two different types of ceramic AlN and $Al_3O_2$. In the single cooled path simulation, Table 1, both ceramic devices had an unexpectedly lower temperature per Watt than the PCB device. The AlN substrate showed a 21% improvement in in overall temperature. In the double cooled path simulation with a heat sink coupled to a first side of the device, Table 2, there was an even greater improvement in temperature. The AlN substrate resulted in a 50% improvement in overall temperature compared with the four layer PCB substrate.

TABLE 1

Single Cooled Path (PCB heat spreader)

| Substrate | ° C./Watt |
|---|---|
| 4 Layer PCB | 28° C./W |
| AlN | 22° C./W |
| Al3O2 | 26° C./W |

TABLE 2

Dual Cooled Path (Added heat sink package top)

| Substrate | ° C./Watt |
|---|---|
| 4 Layer PCB | 16.3° C./W |
| AlN | 8.2° C./W |
| Al3O2 | 8.7° C./W |

Figure 21:
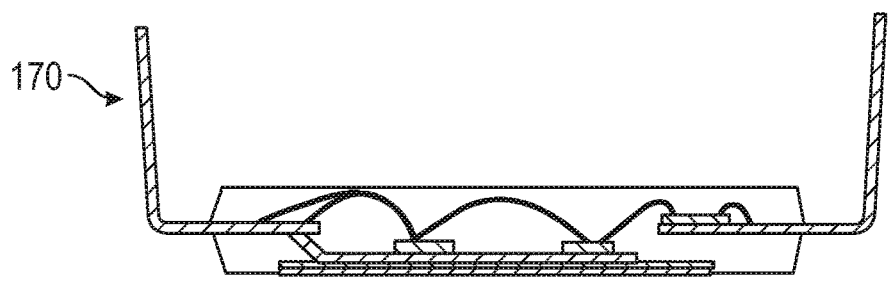
FIG. 21 is a side view of an implementation of a power module.
Figure 22:
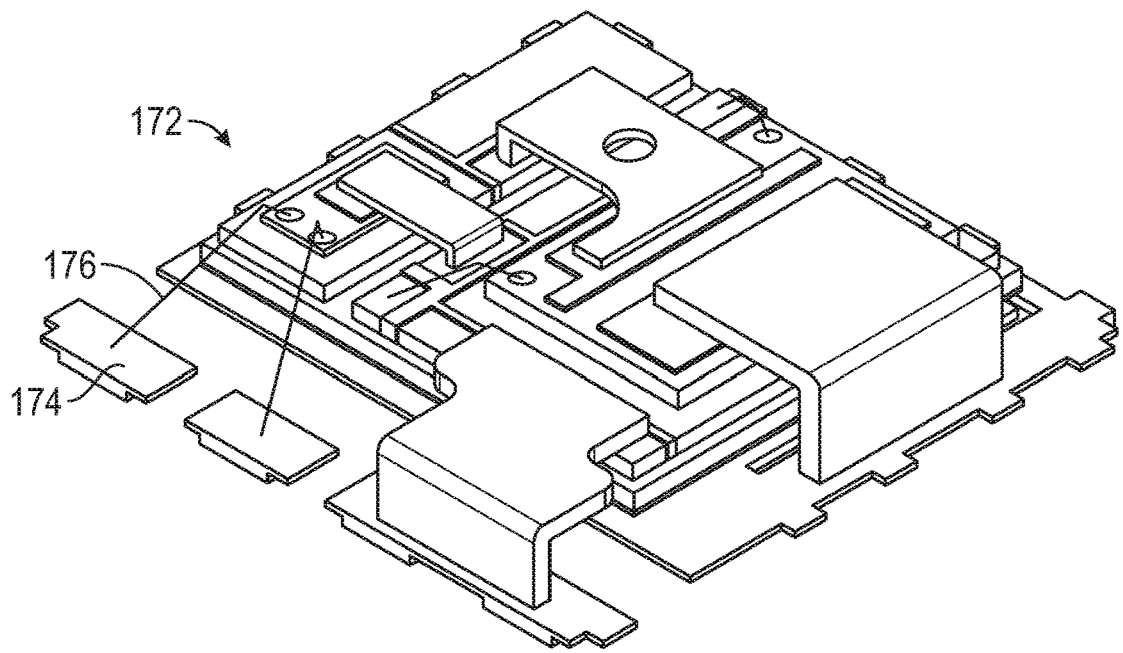
FIG. 22 is a perspective view of an implementation of a semiconductor module.

Comparing the multi-chip module 152 in FIGS. 19-20 to the semiconductor packages illustrated in FIGS. 21 (170) and 22 (172), the multi-chip module 152 has a more compact design. Unlike the package 170 in FIG. 21, there are no projections extending from the multichip module 152. The multi-chip module 152 has a single layer of connections whereas the device 170 in FIG. 21 has at least two layers increasing the thickness of the package. The multi-chip module 152 also has no electrical connectors exposed on the edge of the module. This aspect of the module means that ordinary spacing rules for high voltage devices do not need to be applied to the placement of the module on a motherboard or circuit board, which further saves board space. Unlike the device 172 in FIG. 22, the multi-chip module 152 does not require leads extending from the main portion of the substrate. The encapsulation of the multi-chip module 152 may improve reliability compared with the lead frame design 174 of FIG. 22. In various implementations, where wire bonds are used to connect components, those wire bonds in the multi-chip module 152 may be shorter than the wire bonds in a semiconductor package having lead frame design, an example of which is illustrated in FIG. 22. The internal routing achieved through the traces in the multi-chip module 152 reduces overall package size. A reduction in package size may reduce space restrictions when the multichip module is included in an electronic device.

In places where the description above refers to particular implementations of semiconductor package and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
   a substrate comprising one or more traces on a first side and one or more traces on a second side of the substrate opposite the first side of the substrate, wherein the substrate is rigid;
   at least one die mechanically and electrically coupled to the first side of the substrate, wherein the die is a high voltage die;
   one or more traces extending fully across one or more external edges of the substrate, the one or more traces extending across a full thickness of the substrate located between the first side and the second side; and
   a molding compound covering at least the first side of the substrate and directly coupled to and covering the one or more traces that extend fully across the one or more external edges of the substrate;
   wherein the one or more traces that extend fully across the one or more edges of the substrate across the full thickness physically and electrically connect the one or more traces on the first side of the substrate with the one or more traces on the second side of the substrate.

2. The semiconductor package of claim 1, wherein the substrate is ceramic and comprises one of aluminum nitride, aluminum oxide, or any combination thereof.

3. The semiconductor package of claim 1, wherein the substrate is a direct bonded copper substrate.

4. The semiconductor package of claim 1, wherein the die comprises gallium nitride (GaN).

5. The semiconductor package of claim 1, further comprising one of a clip or two or more wirebonds electrically coupling the one or more die to the substrate.

6. The semiconductor package of claim 5, wherein the clip comprises a thickness from a 3 mil to a 20 mil.

7. The semiconductor package of claim 1, further comprising one or more copper pillars coupled to one of the first side or the second side of the substrate.

8. A semiconductor package comprising:
   a ceramic substrate comprising one or more traces on a first side and one or more traces on a second side of the ceramic substrate opposite the first side of the ceramic substrate, wherein the ceramic substrate is rigid and electrically insulative;
   at least one high voltage die mechanically and electrically coupled to the first side of the ceramic substrate;
   one or more traces extending from the first side to the second side of the ceramic substrate across a full thickness of the ceramic substrate and completely across an external surface of the ceramic substrate located across the full thickness; and
   a molding compound encapsulating at least the first side and fully encapsulating the one or more traces that extend completely across the external surface of the ceramic substrate;
   wherein the molding compound is directly coupled to the one or more traces that extend completely across the external surface of the ceramic substrate; and
   wherein the one or more traces that extend completely across the external surface of the ceramic substrate provide electrical connectivity between the one or more traces on the first side of the ceramic substrate and the one or more traces on the second side of the ceramic substrate.

9. The semiconductor package of claim 8, wherein the ceramic substrate comprises one of aluminum nitride, aluminum oxide, or any combination thereof.

10. The semiconductor package of claim 8, wherein the die comprises gallium nitride (GaN).

11. The semiconductor package of claim 8, further comprising one of a clip of two or more wirebonds electrically coupling the one or more die to the ceramic substrate.

12. The semiconductor package of claim 11, wherein the clip comprises a thickness from a 3 mil to a 20 mil.

13. The semiconductor package of claim 8, further comprising one or more copper pillars coupled to one of the first side or the second side of the ceramic substrate.

14. A substrate for a semiconductor package, the substrate comprising:
one or more traces on a first side of a substrate and one or more traces on a second side of the substrate, the first side opposite the second side;
one or more traces extending across one or more external edges of the substrate, the one or more traces extending across a full thickness of the substrate located between the first side and second side; and
an insulative molding compound directly coupled to and encapsulating the one or more traces extending across the full thickness of the substrate;
wherein the one or more traces that extend along the one or more external edges of the substrate across the full thickness physically and electrically connect the one or more traces on the first side of the substrate with the one or more traces on the second side of the substrate.

15. The semiconductor package of claim 1, wherein the substrate is ceramic and comprises one of aluminum nitride, aluminum oxide, or any combination thereof.

16. The semiconductor package of claim 1, wherein the substrate is a direct bonded copper substrate.

17. The semiconductor package of claim 1, wherein the molding compound is an insulative molding compound.

* * * * *